(12) United States Patent
D'Alessandro et al.

(10) Patent No.: US 9,299,449 B2
(45) Date of Patent: Mar. 29, 2016

(54) METHODS AND APPARATUS FOR SENSING A MEMORY CELL

(71) Applicant: MICRON TECHNOLOGY, INC., Boise, ID (US)

(72) Inventors: Andrea D'Alessandro, L'Aquila (IT); Violante Moschiano, Bacoli (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/886,536

(22) Filed: Oct. 19, 2015

(65) Prior Publication Data

US 2016/0042799 A1  Feb. 11, 2016

Related U.S. Application Data

(63) Continuation of application No. 13/935,625, filed on Jul. 5, 2013, now Pat. No. 9,165,664.

(51) Int. Cl.
*G11C 7/10* (2006.01)
*G11C 16/26* (2006.01)
*G11C 16/24* (2006.01)

(52) U.S. Cl.
CPC ............... *G11C 16/26* (2013.01); *G11C 16/24* (2013.01)

(58) Field of Classification Search
USPC ............... 365/189.011, 189.15, 207, 208
See application file for complete search history.

(56) References Cited

U.S. PATENT DOCUMENTS

| 5,175,450 | A | * | 12/1992 | Chern | G11C 11/4091 327/51 |
|---|---|---|---|---|---|
| 7,881,120 | B2 | | 2/2011 | Yoshihara et al. | |
| 7,948,802 | B2 | | 5/2011 | Sarin et al. | |
| 2006/0050581 | A1 | | 3/2006 | Luk et al. | |
| 2009/0103382 | A1 | | 4/2009 | Luk et al. | |
| 2012/0262993 | A1 | | 10/2012 | Moschiano et al. | |
| 2012/0307566 | A1 | | 12/2012 | Moschiano et al. | |

* cited by examiner

*Primary Examiner* — Vu Le
(74) *Attorney, Agent, or Firm* — Dicke, Billig & Czaja, PLLC

(57) ABSTRACT

Methods of operating a memory include selectively discharging a data line through a memory cell selected for sensing, discharging a sense node to the data line while a voltage level of the sense node is greater than a voltage level of the data line, and inhibiting discharging of the data line to the sense node while the voltage level of the data line is greater than the voltage level of the sense node. Sense circuits include a path between an input node and a sense node facilitating current flow from the sense node to the input node when a voltage level of the sense node is greater than a voltage level of the input node and inhibiting current flow from the input node to the sense node when the voltage level of the sense node is less than the voltage level of the input node.

20 Claims, 9 Drawing Sheets

METHODS AND APPARATUS FOR SENSING A MEMORY CELL

RELATED APPLICATION

This application is a Continuation of U.S. patent application Ser. No. 13/935,625 filed Jul. 5, 2013 (allowed) which is commonly assigned and incorporated herein by reference in its entirety.

TECHNICAL FIELD

The present disclosure relates generally to memory and in particular, in one or more embodiments, the present disclosure relates to sensing operations in memory devices.

BACKGROUND

Memory devices are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM) and Flash memory.

Non-volatile memory is memory that can retain its stored data for some extended period without the application of power. Flash memory devices have developed into a popular source of non-volatile memory for a wide range of electronic applications. Flash memory devices are commonly used in electronic systems, such as personal computers, personal digital assistants (PDAs), digital cameras, digital media players, digital recorders, games, appliances, vehicles, wireless devices, cellular telephones, and removable memory modules, and the uses for Flash memory continue to expand.

Flash memory typically utilizes one of two basic architectures known as NOR Flash and NAND Flash. The designation is derived from the logic used to read the devices. Typically, an array of memory cells for NAND flash memory devices is arranged such that memory cells of a string are connected together in series, source to drain.

Flash memory typically requires a negative voltage source for performing at least a portion of sensing operations, such as read and verify operations, on selected memory cells. These negative voltage sources typically comprise negative voltage charge pumps and tend to consume undesirable amounts of physical space (e.g., real estate) in memory devices. Various methods have been used to attempt to perform negative sensing operations in memory cells without having to rely on circuitry such as the real-estate intensive circuitry of negative charge pumps. However, these methods have their limitations as to the magnitude of negative sensing operations which can be performed in memory devices while still maintaining a desired level of reliability of the sensing operations.

For the reasons stated above, and for other reasons which will become apparent to those skilled in the art upon reading and understanding the present specification, there is a need in the art for expanding negative voltage sensing ranges while mitigating the amount of real estate consumed by support circuitry for performing such sensing operations and maintaining a desired level of reliability in sensing operations performed in memory devices.

DETAILED DESCRIPTION

Figure 1:
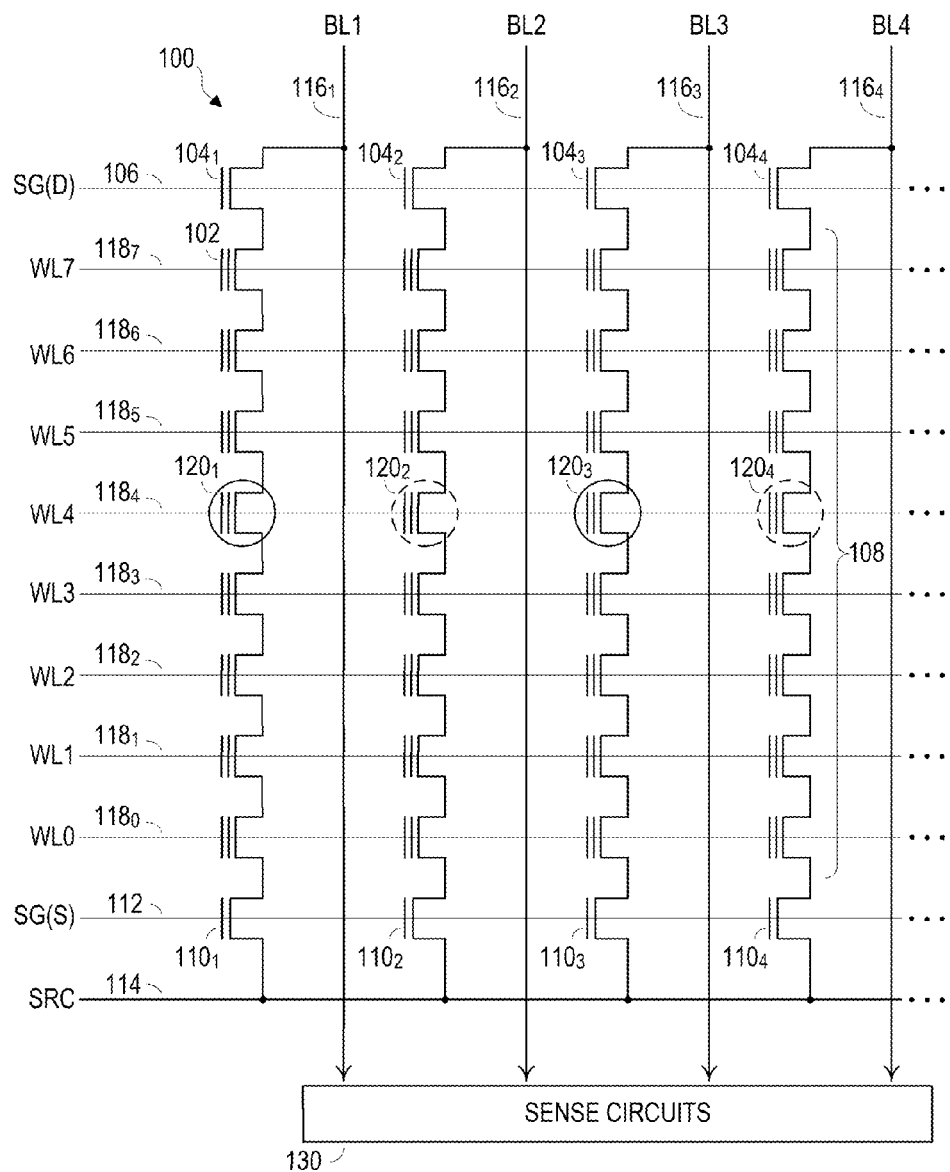
FIG. 1 illustrates a schematic representation of an array of NAND configured memory cells.

In the following detailed description of the invention, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Flash memory typically utilizes one of two basic architectures known as NOR Flash and NAND Flash. The designation is derived from the logic used to read the devices. FIG. 1 illustrates a NAND type flash memory array architecture 100 wherein the memory cells 102 of the memory array are logically arranged in an array of rows and columns. In a conventional NAND Flash architecture, "rows" refers to memory cells having commonly coupled control gates 120, while "columns" refers to memory cells coupled as a particular NAND string 108, for example. A row of memory cells might comprise one or more pages of memory, for example. The memory cells 102 of the array are arranged together in strings (e.g., NAND strings), typically of 8, 16, 32, or more each. Each memory cell of a string are connected together in series, source to drain, between a source (e.g., source line) 114 and a data line 116, often referred to as a bit line. For example, memory cells 102 of a string 108 might be connected to the source 114 through a transistor 110 selectively activated in response to a signal on SG(S) 112 connected to the control gate of the transistor 110, and to a data line 116 through a transistor 104 selectively activated in response to a signal on SG(D) 106 connected to the control gate of the transistor 104.

The array is accessed by a row decoder (not shown in FIG. 1) activating a logical row of memory cells by selecting a particular access line, often referred to as a word line, such as WL7-WL0 $118_7$-$118_0$, for example. Each word line is coupled to the control gates of a row of memory cells. Data lines, often referred to as bit lines, such as BL1-BL4 $116_{1-4}$ can be driven (e.g., biased, by applying a particular potential) high or low depending on the type of operation being performed on the array. These bit lines BL1-BL4 $116_{1-4}$ are coupled to sense circuits (e.g., sense amplifiers) 130 that detect the state of a target memory cell by sensing voltage or current on a particular bit line 116, for example. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. A common naming convention is to refer to SLC memory as MLC (two level) memory as SLC memory utilizes two Vt ranges in order to store one bit of data as represented by a 0 or a 1, for example. MLC memory configured to store two bits of data can be represented by MLC (four level), three bits of data by MLC (eight level), etc. MLC memory cells may further store fractional bits, e.g., using Vt ranges that are not some power of 2. For example, two memory cells using three Vt ranges can collectively represent nine possible data states, which can represent three bits of data, or 1.5 bits per memory cell.

Figure 2:
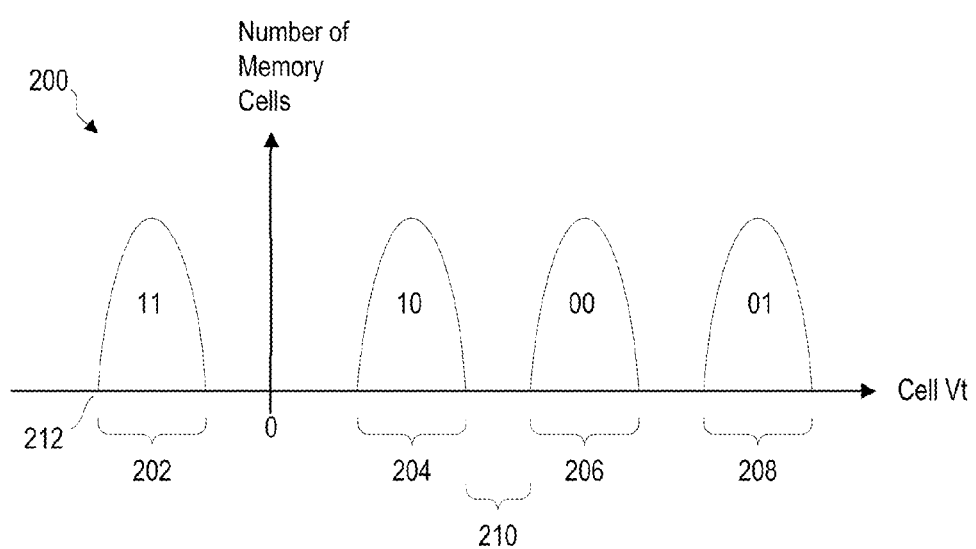
FIG. 2 illustrates a graphical representation of threshold voltage ranges in a population of memory cells.

FIG. 2 illustrates an example of Vt ranges 200 for a population of MLC (four level) (e.g., 2-bit) memory cells. For example, a memory cell might be programmed to a Vt that falls within one of four different Vt ranges 202-208 of 200 mV, each being used to represent a data state corresponding to a bit pattern comprised of two bits. Typically, a dead space 210 (e.g., sometimes referred to as a margin and may have a range of 200 mV to 400 mV) is maintained between each range 202-208 to keep the ranges from overlapping. As an example, if the voltage stored on a memory cell is within the first of the four Vt ranges 202, the cell in this case is storing a logical '11' state and is typically considered the erased state of the cell. If the voltage is within the second of the four Vt ranges 204, the cell in this case is storing a logical '10' state. A voltage in the third Vt range 206 of the four Vt ranges would indicate that the cell in this case is storing a logical '00' state. Finally, a Vt residing in the fourth Vt range 208 indicates that a logical '01' state is stored in the cell.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells are formed, and thus to the channels of the memory cells, in order to remove charges which might be stored on the charge storage structures (e.g., floating gates or charge traps) of the block of memory cells. This typically results in the Vt of memory cells residing in the Vt range 202 (e.g., erased state) of FIG. 2, for example.

Referring again to FIG. 1, programming typically involves applying one or more programming pulses (Vpgm) to a selected word line, such as WL4 118$_4$, and thus to the control gate of each memory cell 120 coupled to the selected word line. Typical programming pulses (Vpgm) start at or near 15V and tend to increase in magnitude during each programming pulse application. While the program voltage (e.g., programming pulse) is applied to the selected word line, a potential (e.g., a voltage), such as a ground potential, is applied to the substrate, and thus to the channels of these memory cells, resulting in a charge transfer from the channel to the floating gates of memory cells targeted (e.g., selected) for programming. More specifically, the floating gates are typically charged through direct injection or Fowler-Nordheim tunneling of electrons from the channel to the floating gate, resulting in a Vt typically greater than zero in a programmed state, for example. In the example of FIG. 1, a Vpass voltage is applied to each unselected word line 118$_{7-5}$ and 118$_{3-0}$. Vpass might be 10V, for example. The Vpass applied to each unselected word line might comprise different voltages. A word line adjacent to the selected word line might be biased to a Vpass potential of 8V and the next adjacent word line might be biased to 7V, for example. The Vpass voltages are not high enough to cause programming of memory cells biased with a Vpass voltage.

An inhibit voltage is typically applied to bit lines (e.g., Vcc) which are not coupled to a NAND string containing a memory cell that is targeted for programming. During a programming operation alternate bit lines may be enabled and inhibited from programming. For example, even numbered bit lines might be enabled for programming memory cells coupled to even numbered bit lines while the odd numbered bit lines are inhibited from programming memory cells coupled to the odd numbered bit lines. A subsequent programming operation might then inhibit the even numbered bit lines and enable the odd numbered bit lines. For example, the memory cells of row 120 having solid line circles are selected for programming whereas the memory cells having dashed line circles are inhibited from programming as shown in FIG. 1.

Between the application of one or more programming (e.g., Vpgm) pulses, a sense operation (e.g., program verify operation) is performed to check each selected memory cell to determine if it has reached its intended programmed state. If a selected memory cell has reached its intended programmed state it is inhibited from further programming by selective biasing of the bit line coupled to the programmed memory cell. Following a program verify operation, an additional programming pulse Vpgm is applied if there are memory cells that have not completed programming. This process of applying one or more programming pulses followed by performing a program verify operation continues until all the selected memory cells have reached their intended programmed states. If a particular number of programming pulses (e.g., maximum number) have been applied and one or more selected memory cells still have not completed programming, those memory cells might be marked as defective, for example.

As discussed above, memory cells might have a negative threshold voltage, such as memory cells having threshold voltages residing in distributions 202 shown in FIG. 2, for example. Previous methods of sensing memory cells having negative threshold voltages comprise generating a negative voltage, such as with negative voltage charge pumps, to apply a negative potential to the memory cells to perform a sense operation. These negative voltage charge pumps typically consume an undesirable amount of real estate and add further circuit complexity to memory devices. Alternate sensing methods have been used to attempt to perform sense operations without generating a negative voltage. Some of these methods include source side sensing, back bias sensing and bit-line boost negative sensing (BBNS) methods, for example. Methods such as source side sensing and back bias sensing methods are typically able to discriminate to sense threshold voltages down to voltages near −1.5V. For example, the point indicated at 212 shown in FIG. 2 might be −1.5V. Thus, point 212 may indicate a negative limit of memory cell threshold voltages which might be reliably sensed using these sensing methods. BBNS methods typically facilitate sensing operations to discriminate to voltages lower than source side sensing and back bias sensing methods. However, BBNS methods are still limited in the negative threshold voltages they can discriminate and are typically limited to performing sensing operations with steady state word line voltages.

Figure 3:
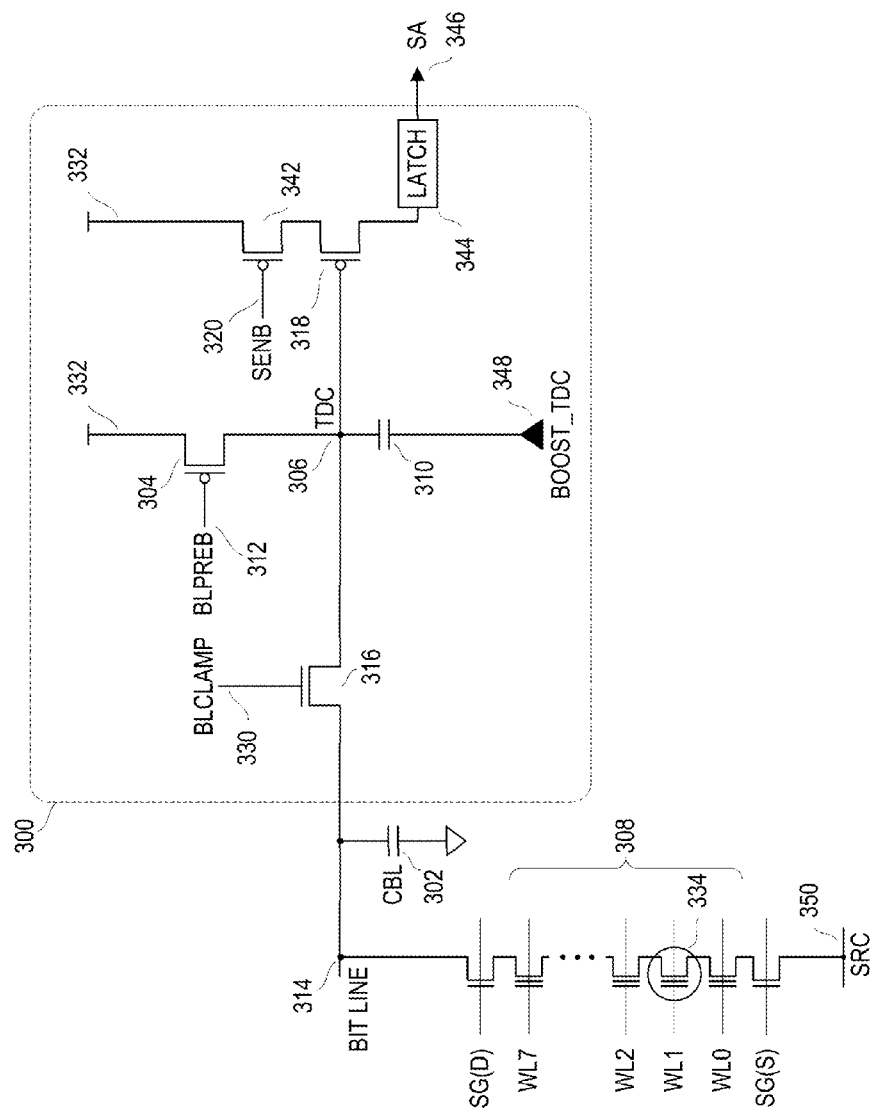
FIG. 3 illustrates a schematic representation of a typical sense circuit using a boosted sense node coupled to a NAND string of memory cells.

Sense circuits are typically utilized in memory devices to facilitate performing a sense (e.g., read and/or verify) operation on each of one or more selected (e.g., target) memory cells in the memory device. FIG. 3 illustrates a typical sense circuit 300. Sense circuit 300 is shown coupled to a particular string of memory cells 308 by a particular bit line 314, such as shown by string 108 and bit lines 116 of FIG. 1, for example. Capacitor CBL 302 is representative of the characteristic capacitance of bit line 314 and memory cell string 308, for example. As part of a sense operation, the sense circuit 300 injects a reference current into a sense node (e.g., TDC node) 306 by activating a PMOS transistor 304 by driving the signal line BLPREB 312 to a particular voltage level. Transistor 304 is coupled to a voltage source 332 and to the TDC node 306. Voltage source 332 might be Vcc, for example. The capacitor 310 shown coupled to the TDC node 306 is representative of the capacitance at the node 306 and additional circuitry coupled to it, such as PMOS transistor 318, for example.

Additional transistors of the sense circuit facilitate sensing of a potential on the TDC node 306. For example, the control gate of transistor 318 is shown coupled to the TDC node 306. Thus, transistor 318 is configured to be responsive to a potential present on the TDC node 306. Signal line SENB 320 coupled to PMOS transistor 346 facilitates isolating the transistor 318 from the voltage source 332. The SA signal line 346 might be coupled to additional control circuitry (not shown) of the memory device configured to respond to the sense circuit as part of a sensing operation. The output signal on signal line SA 346 might comprise a signal generated by a LATCH (e.g., latch circuit) 344 which is representative of a logic level, such as a logic 'high' or logic 'low' level indicative of a sensed data state of a selected memory cell 334, for example.

During a precharge portion of a sense operation, the gate of transistor 304 is biased by a potential on signal line BLPREB 312 to precharge the node 306 by injecting a precharge current into the TDC node 306. An additional potential (e.g., VBLCLAMP+VSRC) is applied to signal line BLCLAMP 330. Biasing the gate of transistor 316 pulls up the bit line 314 to a potential of VBLCLAMP−Vth+VSRC. (Where Vth is a threshold voltage of transistor 316.) An elevated source potential (e.g., VSRC) is applied to the source SRC 350.

Following the precharging of the TDC node 306 and the bit line 314, a second portion of the sense operation is performed. During this portion of the sense operation, word lines coupled to unselected memory cells, such as WL0 and WL2-WL7 of string 308, might be biased with a Vpass potential. The Vpass potential activates the unselected memory cells coupled to these word lines to operate in a pass through mode regardless of their programmed state. The word line coupled to the selected memory cell, such as WL1 coupled to selected memory cell 334, might be biased with a particular sense potential (e.g., sensing voltage) in order to determine a data state of the selected memory cell 334. If the threshold voltage of the selected memory cell 334 is above the particular applied sense potential, the selected memory cell 334 will not be activated and the bit line 314 will remain at the precharged (VBLCLAMP−Vth+VSRC) potential. If the threshold voltage of the selected memory cell 334 is below the applied sense potential, the selected memory cell will be activated and the bit line 314 will be discharged through the string of memory cells 308, for example. This will also discharge (e.g., pull-down) the potential of the TDC node 306. Thus, the sense circuit 300 detects whether or not the pre-charged bit line 314 and TDC node 306 is discharged during the sense operation to determine the data state of the selected memory cell 334.

The sense circuit 300 is typically configured to have a threshold point (e.g., sense threshold level) close to the precharge potential that is established on the TDC node 306 prior to sensing the selected memory cell. The threshold point might be a particular potential on the TDC node wherein the sense circuit outputs a first logic level indicative of a first data state of a sensed selected memory cell when the potential of the TDC node is equal to or above the threshold point. The sense circuit might output a second logic level indicative of a second data state of the sensed selected memory cell when the potential of the TDC node is below the threshold point, for example. However, selecting a threshold point close to the precharge potential potentially risks erroneous indications of the data state of a selected memory cell if undesired leakage currents exist during the sense operation.

Figure 4:
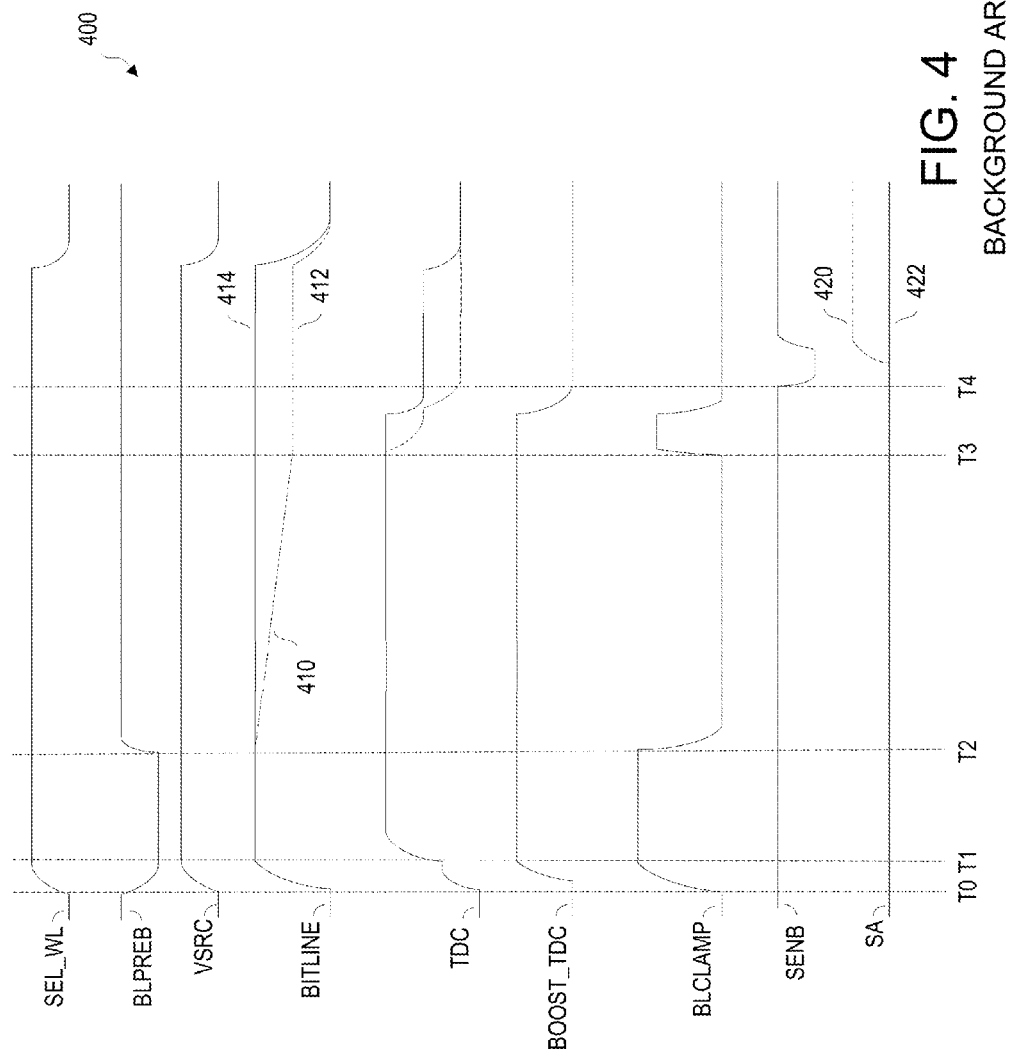
FIG. 4 illustrates a plot of waveforms for a typical sense operation using a boosted sense node technique.

As discussed above, BBNS sensing methods attempt to facilitate sensing a negative threshold voltage in selected memory cells without generating a negative word line potential. FIG. 4 illustrates a plot of waveforms which might be applied to the sense circuit of FIG. 3 during a back bias sensing operation, for example. A precharge phase of the sensing operation occurs between time T0 and time T2 shown in FIG. 4. It is noted that a sense potential SEL_WL applied to a word line coupled to a selected memory cell, such as memory cell 334 shown in FIG. 3, is established and applied throughout the sensing operation illustrated in FIG. 4.

During the precharge phase, a BLPREB 312 signal line is driven to a low potential so as to activate transistor 304 to pull up the TDC node 306 to a potential of the voltage source 332. A BLCLAMP potential, applied to signal line 330, is applied to the gate of transistor 316 to activate the transistor and couple the bit line 314 to the TDC node 306. An elevated source potential VSRC is applied to the source SRC 350 coupled to the NAND string 308. These potentials facilitate charging the bit line 314 and the TDC node 306 in preparation for performing the sense operation. At time T2, the potential of the BLPREB signal line 312 transitions to a potential to deactivate transistor 304. The potential applied to BLCLAMP 330 is also transitioned to a potential (e.g., 0V) so as to deactivate transistor 316 and decouple the bit line 314 from the TDC node 306.

The SEL_WL potential is still applied to the word line coupled to the selected memory cell 334 at time T2. If the selected memory cell 334 is activated in response to the applied SEL_WL potential then the potential of the bit line 314 will discharge 410 through the activated selected memory cell 334 to a potential near the VSRC potential applied to the SRC 350. If the selected memory cell 334 is not activated by the applied SEL_WL potential, then the bit line potential will be maintained 414.

At time T3 shown in FIG. 4, a potential is applied to the BLCLAMP signal line 330 to activate transistor 316. The TDC node will then be discharged to the bit line potential. The bit line potential might be that of the VSRC potential applied to the source if the selected memory cell was activated. If the bit line 344 has been discharged 412, such as discharged to the VSRC potential applied to the SRC 350, then the potential of the TDC node 306 will begin to be discharged through transistor 316 to that of the bit line potential. If the bit line 344 has not been discharged 414, the potential of the TDC node 306 will not be discharged. The potential applied to the BLCLAMP signal will again transition to a low level (e.g., 0V) so as to deactivate transistor 316. Transistor 342 is activated at time T4 so that the potential of the TDC node 306 can be sampled by the transistor 318. Transistor 342 can be activated by a low potential (e.g., 0V) applied to the signal line 320, for example.

The SA signal line 346 will have a potential (e.g., high or low) in response to the activated transistor 342 and the potential of the TDC node 306 which is coupled to the gate of transistor 318. For example, if the potential of the TDC node 306 is low enough to activate the transistor 318, then a potential at an input to the LATCH 344 will be pulled up through activated transistors 318, 342 to a potential of the voltage source 332 as indicated by line 420 shown in FIG. 4. If the potential of the TDC node 306 is above threshold voltage of transistor 318, then transistor 318 will not be activated and the potential of the SA signal line will remain at a low (e.g., 0V) level 422, for example.

However, the sense operation discussed with respect to FIGS. 3 and 4 have a number of limitations. For example, if the VSRC potential applied to the source SRC 350 is too high, the bit line 314 and the TDC node 306 might not discharge a sufficient amount to fall below the threshold voltage of transistor 318 in the case where the selected memory cell was activated by the applied SEL_WL potential. For example, a selected memory cell might be activated by the SEL_WL potential applied to it and the bit line will be discharged to the VSRC potential. However, the bit line potential might be above the threshold voltage of transistor 318. Thus, transistor 318 would not be activated and the potential of the SA signal line would not correctly indicate the state of the selected memory cell. Further, the method illustrated by FIGS. 3 and 4 introduce undesirable time delays in performing the sense operation. For example, there is a delay between the end of the precharge phase and the beginning of the sense phase. The TDC node 306 is sensed while transistor 316 is deactivated. Thus an additional delay occurs in applying the BLCLAMP potential at time T3 to activate transistor 316 at time T3 and to and transition the BLCLAMP potential back to a low potential to deactivate transistor 316 before the TDC node 306 is sensed at time T4. Further limitations include that a single SEL_WL potential is applied throughout the sensing operation. Thus, these methods might only be used with SLC memory cells or multiple sensing operations might be required to sense MLC memory cells, for example.

Figure 5:
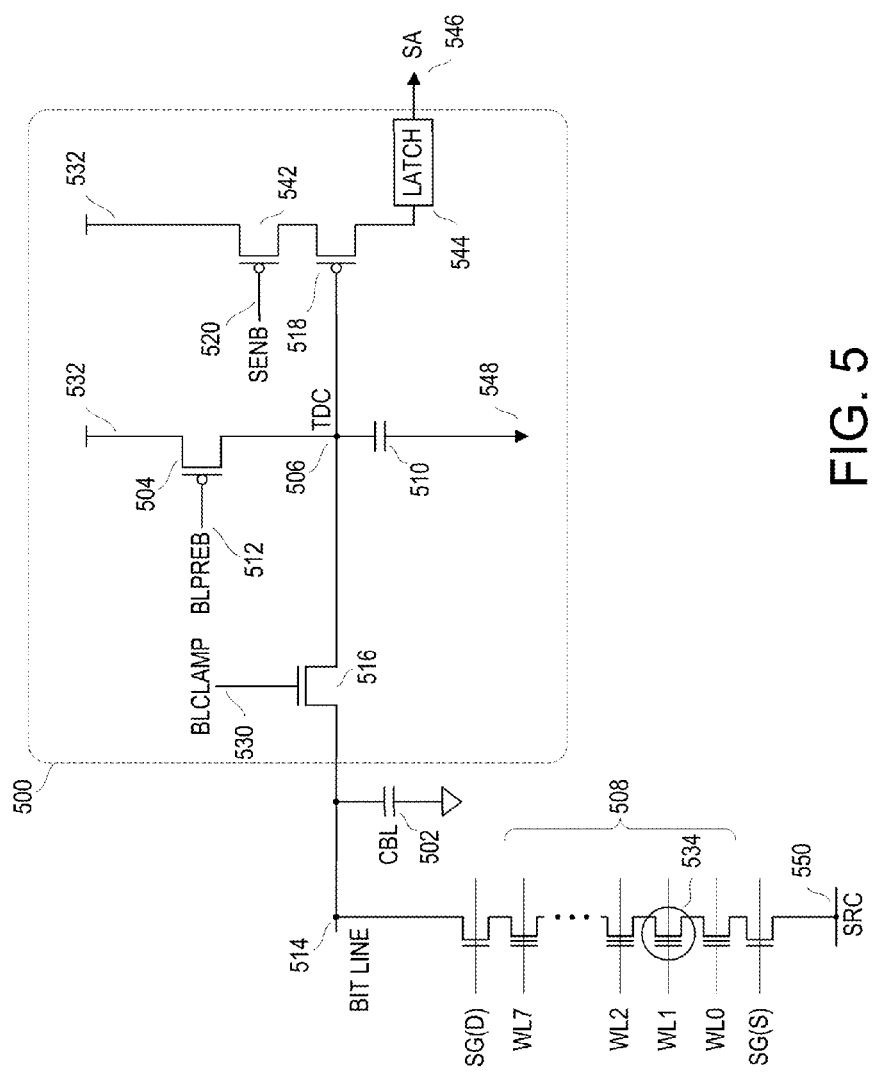
FIG. 5 illustrates a schematic representation of a typical sense circuit without a boosted sense node coupled to a NAND string of memory cells.
Figure 6:
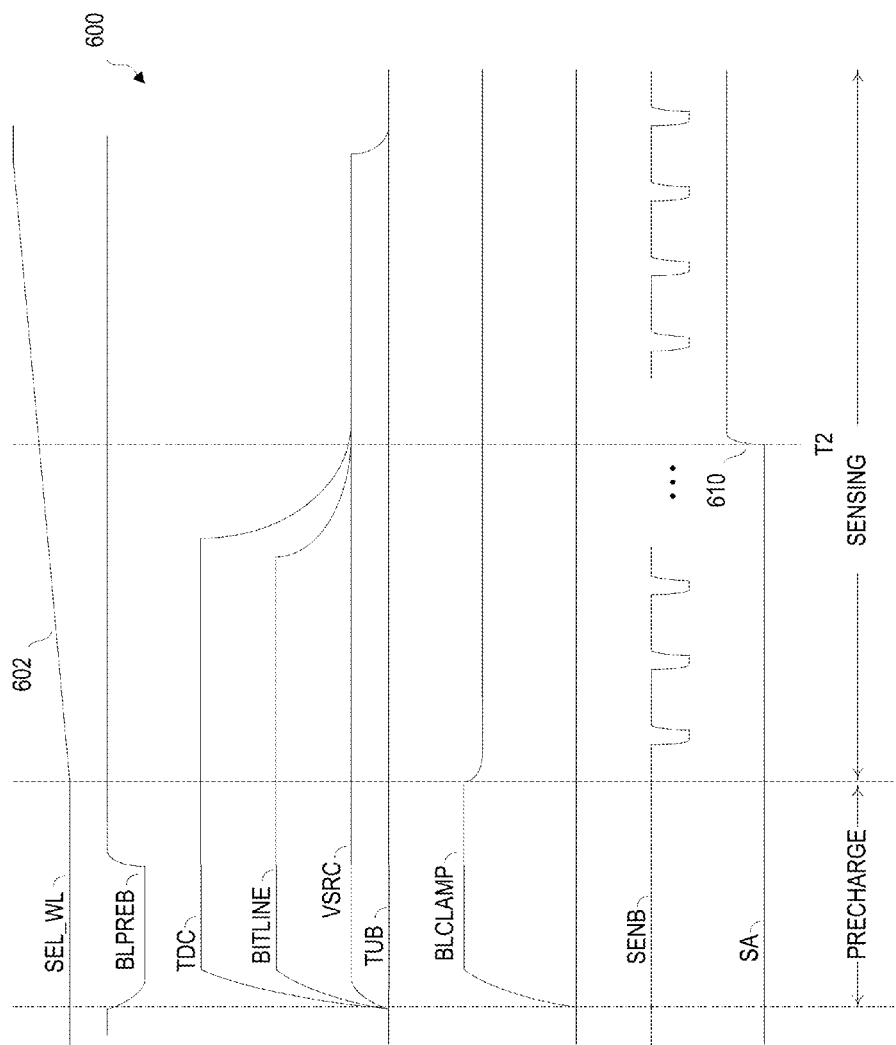
FIG. 6 illustrates a plot of waveforms for a typical ramp read operation.

Another sensing method comprises applying a ramped sense potential to a word line coupled to a selected memory cell and is illustrated by reference to FIGS. 5 and 6. Sense circuit 500 is coupled to a string of memory cells 508 by a bit line 514. The string of memory cells 508 is also coupled to a source SRC 550. The sense operation 600 comprises a precharge phase, shown between time T0 and T1, and a sensing phase following the precharge phase.

During the precharge phase, PMOS transistor 504 is activated by applying a low potential (e.g., 0V) to the signal line BLPREB 512. Activating transistor 504 couples the TDC node 506 to a potential of a voltage source 532, such as VCC, for example. An VSRC potential is applied to the source SRC 550. A BLCLAMP potential is applied to the signal line 530. A resulting bit line potential on bit line 514 during the precharge phase might be (VBLCLAMP−Vth)+VSRC similar to that discussed above with respect to FIG. 3, for example.

In contrast to the sense operation discussed above with respect to FIG. 4, FIG. 6 illustrates that a BLCLAMP potential is applied to the transistor 516 throughout the precharge phase and the sensing phase. Further, the potential SEL_WL applied to the word line coupled to the selected memory cell 534 comprises a ramped potential 602. Thus, during a sense operation the sense potential SEL_WL increases over a range of threshold voltages wherein the selected memory cell is activated when the sense potential applied to the selected memory cell is sufficient to activate the selected memory cell. During the sense operation, the TDC node 506 is periodically sampled (e.g., strobed) by applying a periodic signal SENB to the gate of transistor 542. When the selected memory cell has activated responsive to the ramped SEL_WL potential the bit line 514 will be discharged to a level of the VSRC potential applied to the source. Upon the next sense iteration of the TDC node the SA output signal on signal line 546 will change states, such as shown at point 610 at time T2 of FIG. 6.

This method also has limitations in that if the applied VSRC potential is too high, the resulting potential on the TDC node might not drop low enough to activate the PMOS transistor 518 and the selected memory cell will not be successfully sensed. For example, the applied VSRC potential might be limited to 1V or less to obtain reliable sensing operations.

Figure 7:
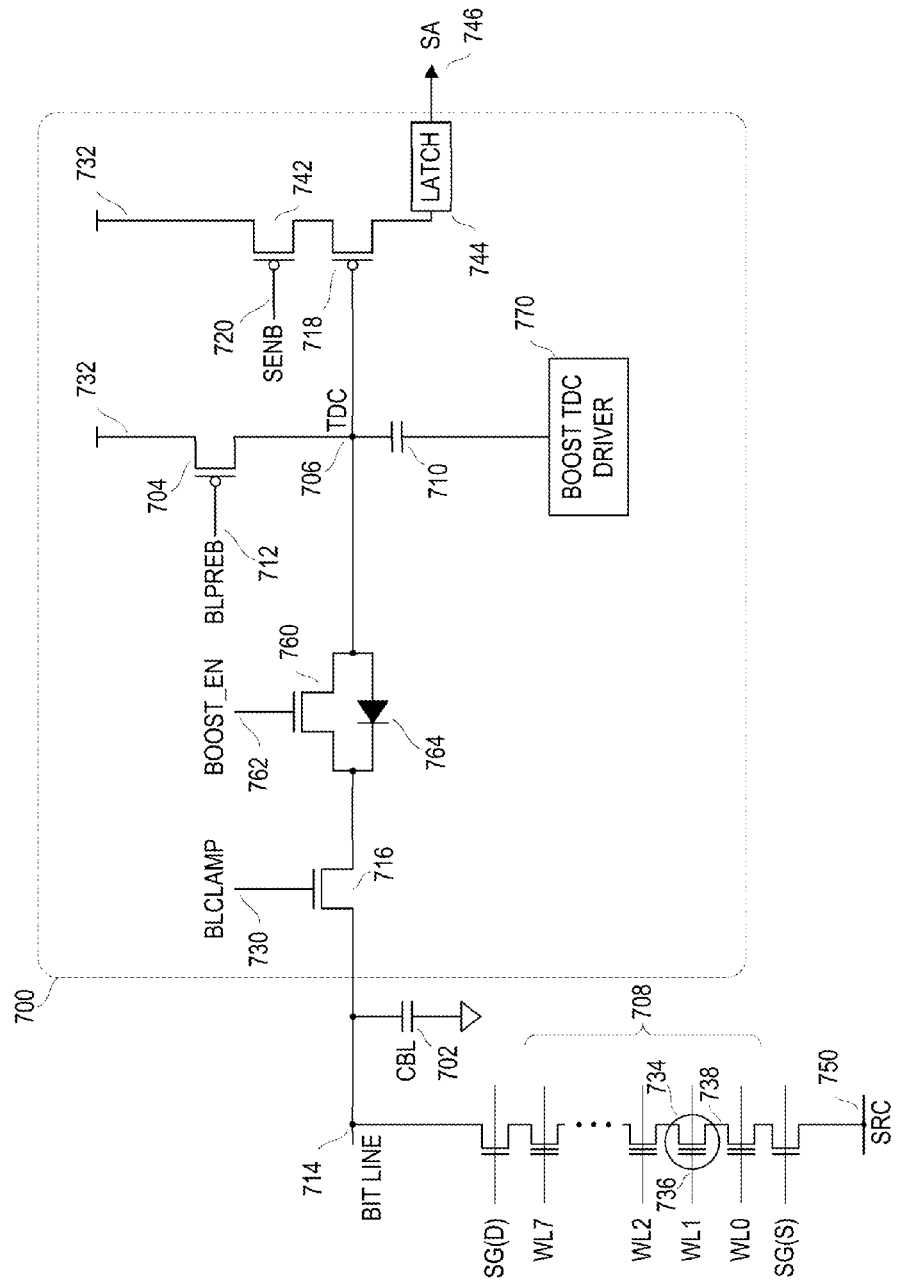
FIG. 7 illustrates a schematic representation of a sense circuit coupled to a NAND string of memory cells according to an embodiment of the present disclosure.

FIG. 7 illustrates a sense circuit 700 according to an embodiment of the present disclosure. The sense circuit 700 shown in FIG. 7 facilitates performing a sense operation with a ramped selected word line potential and facilitates an increase in the negative sense range of memory cells without generating negative voltages. Sense circuit 700 comprises an input node, such as to couple the sense circuit to the bit line 714. Sense circuit 700 further comprises an output node, such as identified in FIG. 7 as signal line SA 746. The signal line SA 746 might transfer a logic level signal, such as a logic high or logic low signal level. The logic level of a signal on signal line SA 746 might transition from a logic low to a logic high, or vice versa, in response to activating the selected memory cell during a sensing operation, for example. LATCH 744 facilitates maintaining the logic level of the signal line SA 746 after a transition of the logic level of the signal line SA 746.

Sense circuit 700 is shown coupled to a string of memory cells 708 (e.g., NAND string of memory cells) by a bit line 714. The string of memory cells 708 might be formed in what is sometimes referred to as a tub or well region of a semiconductor substrate of a memory device. Capacitor CBL 702 is representative of the characteristic capacitance of the bit line 714 and coupled string of memory cells 708. A target memory cell 734 (e.g., selected memory cell) might be identified and selected for a sensing operation performed according to various embodiments of the present disclosure. The string of memory cells 708 is also coupled to a source (e.g., source line) 750 such as discussed above with respect to FIG. 1, for example.

The sense circuit 700 shown in FIG. 7 according to various embodiments includes a transistor 760 coupled between the TDC node 706 and the transistor 716. The control gate of transistor 760 is coupled to a control signal line BOOST_EN 762. A diode 764 is coupled in parallel with transistor 760 and between the TDC node 706 and transistor 716. As shown in FIG. 7, an anode terminal of diode 764 may be coupled to the TDC node 706 and a cathode terminal of the diode may be coupled to transistor 716 according to one or more embodiments of the present disclosure. The diode 764 is configured where it allows a potential to discharge from the TDC node 706 into the bit line 714 coupled to the sense circuit. However, the diode 764 inhibits a discharge of a potential from the bit line into the TDC node. Transistor 760 is configured whereas it allows a potential to discharge from the bit line into the TDC node when transistor 760 is activated, such as by driving the gate of transistor 760 with a BOOST_EN control signal. The BOOST_EN control signal might be substantially equal to 3.6V, for example, to activate the transistor 760. FIG. 7 further illustrates BOOST TDC DRIVER circuitry 770 which may be configured as a voltage generator. BOOST TDC DRIVER circuitry 770 is configured to generate a potential which induces another potential on the TDC node 706 to boost the TDC node to a higher potential, such as through capacitive coupling 710. BOOST TDC DRIVER circuitry 770 is further configured to generate a series of pulses (e.g., periodically generate voltage pulses) to be coupled to the TDC node 706, such as during a sensing operation according to one or more embodiments of the present disclosure. The series of voltage pulses generated by the BOOST TDC DRIVER circuitry 770 might have a level of Vcc, for example.

A control gate of transistor (e.g., sense transistor) 718 is coupled to the TDC node 706 to facilitate sensing a potential of the TDC node 706. According to one or more embodiments, transistor 718 comprises a PMOS type transistor. Thus, transistor 718 might be activated when a potential of the TDC node 706 is below a threshold voltage of transistor 718. Transistor 718 might be deactivated when the potential of the TDC node is above the threshold voltage of transistor 718. Transistor 718 is coupled to a voltage source 732 by transistor 742. A control gate of transistor 742 is coupled to receive control signal SENB from signal line 720. Transistor 742 might comprise a PMOS transistor similar to that of transistor 718. Thus, a SENB control signal which is below a threshold voltage of transistor 742 will activate the transistor and couple the transistor 718 to the voltage source 732, such as Vcc, for example. A SENB control signal having a potential higher than the threshold voltage of transistor 742 will deactivate the transistor. Transistor 718 is shown coupled to an input of LATCH 744. LATCH 744 is configured to output a signal on the sense circuit output node SA 746 responsive to a potential on the source/drain terminal of transistor 718 coupled to the input of the LATCH 744.

Thus, transistors 742 and 718 are configured to facilitate sensing a potential of the TDC node 706 in response to a level of the SENB control signal applied to the control gate of transistor 742. For example, sensing of the TDC node 706 might be performed responsive to applying a SENB control signal having a logic low level to activate transistor 742. If the potential of the TDC node 706 is less than the threshold voltage of transistor 718, then transistor 718 may be activated and the input to the LATCH 744 will be pulled up to the voltage source 732 through the activated transistors 718 and 742. The LATCH 744 is configured to drive and maintain a logic high level on the signal line SA 746 in response to its input being pulled up to the potential (e.g., Vcc) of voltage source 732. If the potential of the TDC node 706 is higher than the threshold voltage of transistor 718, transistor 718 may not be activated and the LATCH will output and maintain a logic low level signal on the signal line SA 746. A transition of a level (e.g., logic level) of the signal line SA 746 can be indicative that the selected memory cell 734 has been activated during a sensing operation of the selected memory cell, for example.

Figure 8:
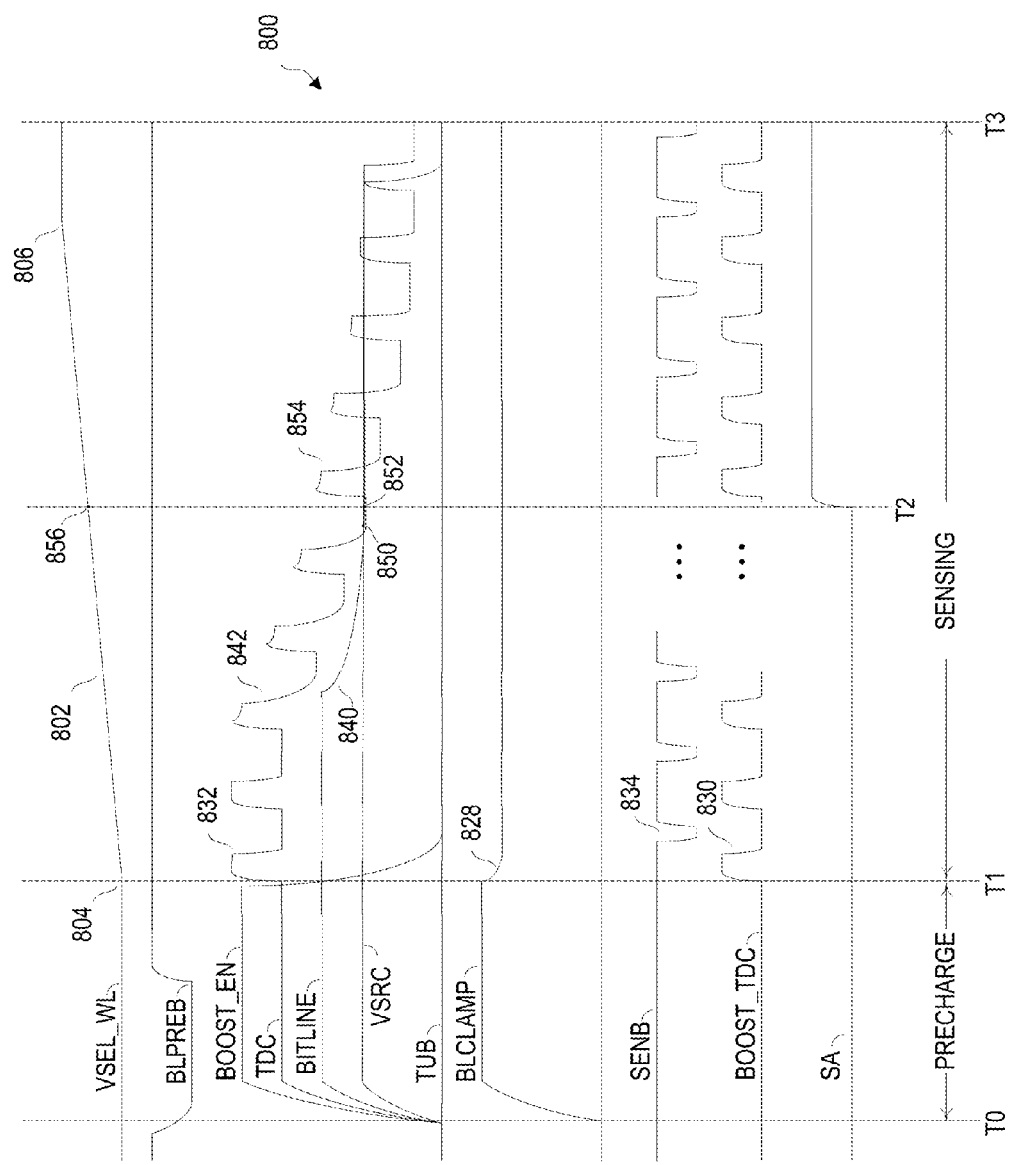
FIG. 8 illustrates a plot of waveforms corresponding to a sense operation performed according to an embodiment of the present disclosure.

A sensing operation according to one or more embodiments of the present disclosure can be described by way of example and reference to FIGS. 7 and 8. A memory cell 734 might be selected for a sensing operation to determine a threshold voltage (or a value corresponding to a threshold voltage) of the selected memory cell which is representative of a programmed state of the cell. As discussed above, a threshold voltage of a selected memory cell might be a negative value. The sense circuit of FIG. 7 facilitates performing a sense operation and is configured to determine if the selected memory cell has a negative threshold voltage without generating a negative sense potential. The sense circuit shown in FIG. 7 further facilitates performing a sense operation on a selected memory cell using a ramped word line voltage VSEL_WL 802 shown in FIG. 8. Unselected memory cells of the string of memory cells 708 (e.g., other than the selected memory cell) might be operated in what is referred to as a pass through mode throughout the sensing operation (e.g., activated regardless of their data values).

A sensing operation according to various embodiments and illustrated by FIG. 8 comprises two phases of operation, where each phase might be performed over a respective time frame. For example, a first phase of the sensing operation might be performed over a first time frame comprising time T0 to time T1. A second phase of the sensing operation might follow the first phase and be performed over a second time frame comprising time T1 to time T3. The first phase of the sensing operation comprises a precharge phase to precharge the bit line 714 coupled to the string of memory cells 708 and to precharge the TDC node 706 in preparation for sensing the selected memory cell 734. A second phase of the sensing operation comprises a sensing phase where the threshold voltage of the selected memory cell 734 might be determined. A controller (not shown in FIG. 7) of a memory device comprising sense circuit 700 might be configured to generate, manage and apply one or more of the various signals 800 shown in FIG. 8. For example, the controller (e.g., control circuitry and/or firmware) might be configured to regulate the levels (e.g., magnitude) and/or relative timing of the signals shown in FIG. 8, for example.

Signals generated as part of the precharge phase of the sensing operation are illustrated between time T0 and time T1 of FIG. 8. A potential VSRC is applied to the source (SRC) 750 shown in FIG. 7. The VSRC potential might be 2V and may be applied throughout the precharge and the sensing phases of the sensing operation, for example. As indicated in FIG. 8, a tub associated with the selected memory cell might be biased to 0V throughout the sensing operation. Transistor 704 is activated by the signal BLPREB driven (e.g., driven low) on signal line 712. Transistor 704 in an activated state biases the TDC node 706 up to a potential of voltage source 732, such as Vcc, for example. A control signal BLCLAMP is applied to the control gate of transistor 716 on signal line 730, for example. This activates transistor 716 to couple the bit line 714 to one of the source/drain terminals of transistor 760. The potential of BLCLAMP might comprise a first potential (e.g., VBLCLAMPI) added to a potential equal to the VSRC potential. Thus, a resulting elevated bit line potential on the bit line 714 might be (VBLCLAMPI+VSRC−Vt). Wherein Vt might comprise a threshold voltage of transistor 716. A BOOST_EN control signal is generated and applied to signal line 762 which is coupled to the control gate of transistor 760. The BOOST_EN control signal activates transistor 760 thereby coupling the transistor 716 and bit line 714 to the TDC node 706. The BOOST_EN control signal might be 3.6V, for example, to activate the transistor 760. Subsequent to precharging the TDC node 706 and the bit line 714 to their respective precharge phase potentials, the BOOST_EN control signal might be adjusted (e.g., reduced) so as to deactivate transistor 760.

The sensing phase of the sensing operation is initiated subsequent to performing the precharge phase, such as indicated at time T1 of FIG. 8, for example. A ramped potential VSEL_WL 802 may be applied to a word line coupled to the selected memory cell, such as memory cell 734 shown in FIG. 7. The ramped potential VSEL_WL 802 might begin at first potential 804 and increase at a particular rate to a second potential 806. The first potential (e.g., minimum potential) might be 0V and the second potential (e.g., maximum potential) might be 6V, for example. As discussed above, the threshold voltage of a memory cell (e.g., a selected memory cell) might be negative. The ramped potential VSEL_WL 802 shown in FIG. 8 has a minimum potential of 0V. However, a negative threshold voltage of a selected memory cell 734 might be determined by applying the ramped VSEL_WL potential 802 which does not comprise a negative potential component and may be discussed by way of example and reference to FIGS. 7 and 8.

FIG. 8 illustrates that at time T1 corresponding to the initiation (shown at point 804) of the ramped potential VSEL_WL 802 that the source 750 is biased to a positive potential VSRC, such as 2V, for example. Thus, the gate terminal 736 to source terminal 738 potential (i.e., VGS) on the selected memory cell 734 is a negative value respective to the memory cell. For example, VGS might be VSEL_WL−VSRC (e.g., VGS=0V−2V=−2V) at time T1 shown in FIG. 8. Thus, the selected memory cell 734 is in a biased condition having an effective negative gate potential without having generated a negative potential in the memory device. The range of threshold voltages that might be sensed in memory cells by applying the ramped potential 802 might correspond to the difference between the second (e.g., upper) potential 806 and the first (e.g., lower) potential 804. For example, the difference between the upper potential 806 and lower potential 804 shown in FIG. 8 is 6V−0V=6V. The ramped potential 802 might be applied to memory cells having been programmed to threshold voltages within a 6V range. Thus, a memory cell which might be programmed to a threshold voltage between −4V to 2V (e.g., having an absolute difference of 6V) might be sensed with the ramped potential 802, for example.

Another characteristic of the selected memory cell 734 which might be affected by the biasing conditions shown in FIG. 8 is an effect typically referred to as the "body effect." The body effect is exhibited as a change in the threshold voltage of a transistor, such as selected memory cell 734, as a result of a potential difference between the source and the body (e.g., bulk) of the transistor under biased conditions. This potential difference is sometimes referred to as VSB (e.g., 'Vsource-bulk.') As discussed above, memory cells, such as the string of memory cells 708, might be formed in a tub (e.g., substrate tub) (not shown in FIG. 7.) FIG. 8 illustrates that the a tub potential TUB might be held at a reference potential, such as 0V or ground potential, for example. Thus, as the source terminal 738 of selected memory cell 734 is biased to VSRC and the tub (e.g., body or bulk region of memory cell 734) is biased to 0V, a VSB of VSRC−TUB bias (e.g., VSB=2V−0V=2V) might exist in memory cell 734. Typically a positive VSB has an effect of increasing the threshold voltage of a transistor. The effects on threshold voltage of a memory cell due to this body effect might be determined by modeling and/or other methods of measurement as are known to those skilled in the art. For example, a known effect of the body effect (e.g., known increase in Vt) might be considered when determining a sensed threshold voltage for a selected memory cell or for determining a value corresponding to an actual threshold voltage of a selected memory cell.

At time T1, the SA signal line 746, as driven by the LATCH 744, has a low (e.g., logic low level) potential as indicated in FIG. 8 between times T0 and T2. Concurrent with the initiation of the sensing operation, the BLCLAMP potential might be reduced 828 from the potential applied to signal line 730 during the precharge phase (e.g., VBLCLAMPI+VSRC) to a potential of VBLCLAMPF+VSRC, where VBLCLAMPI is greater than VBLCLAMPF. According to various embodiments, VBLCLAMPI and VBLCLAMPF are selected such that transistor 716 might be activated while the potential (VBLCLAMPI+VSRC) is applied to the signal line 730, and where transistor 716 might be deactivated when the VBLCLAMPF+VSRC is applied to the signal line 730 and while the bit line 714 is still precharged. However, the transistor 716 may become activated if the potential of the bit line 714 begins to discharge, such as in response to the activation of a selected memory cell 734 of the string of memory cells 708 coupled to the bit line 714 during the sensing phase, for example. VBLCLAMPI might comprise a potential of 1.5V and VBLCLAMPF might comprise a potential of 1.3V, for example.

According to various embodiments, the potential of the TDC node 706 is repeatedly sensed (e.g., periodically sensed) throughout the sensing phase of the sensing operation. The TDC node 706 might be sensed every 300 nS, for example. Prior to sensing the TDC node 706, a BOOST_TDC voltage pulse 830 is generated by the BOOST TDC DRIVER circuit 770 and is capacitively coupled 710 to the TDC node 706 to induce a corresponding increase in the potential (e.g., indicated at 832) of the TDC node 706. Subsequent to each voltage pulse 830 generated by the BOOST TDC DRIVER circuit 770, the level of the SENB control signal is transitioned (e.g., to a logic low level) 834 to initiate sensing of the TDC node 706 by transistors 718 and 742 as discussed above.

The BOOST_TDC voltage pulses followed by a logic low level of the SENB signal is repeated while the ramped potential VSEL_WL 802 continues to ramp up. As the ramped potential VSEL_WL 802 applied to the selected memory cell 734 achieves a potential sufficient to activate the selected memory cell, the bit line 714 potential will begin to discharge, as indicated at 840, through the string of memory cells 708 including the activated selected memory cell 734. The remaining memory cells of the string of memory cells might be operated in a pass through mode during the sensing operation as discussed above. Thus, the potential of the bit line 714 will be pulled down towards the VSRC potential of the source 750 responsive to the activation of the selected memory cell 734. As the bit line 714 potential decreases 840, the potential of the TDC node will also discharge 842 through the diode 764 coupled between the TDC node 706 and the bit line 714 by way of transistor 716.

The potential of the bit line 714 and the TDC node will continue to discharge to a level substantially equal to the VSRC potential applied to the source 750. The discharge of the bit line 714 will cease when the bit line potential reaches the VSRC potential such as indicated at point 850 in FIG. 8. However, the VSRC potential might be too high to activate the transistor 718 coupled to the TDC node 706 so as to indicate that the selected memory cell has been activated. Thus, according to various embodiments, the diode 764 may become reverse biased as the TDC potential of the TDC node 706 continues to discharge below the bit line potential (e.g., VSRC) due to the de-boosting operation, when the TDC node 706 is pulled down again with the BOOST TDC DRIVER circuitry 770.

As the potential of the TDC node 706 continues to discharge to a level equal to or less than the threshold voltage of transistor 718 (e.g., as indicated by point 852), transistor 718 may be activated along with the next successive activation of transistor 742 by the transition (e.g., high to low level) of the SENB control signal. The potential of the TDC node 706 shown at point 852 might be 1V, for example. As transistor 742 is activated responsive to the applied SENB control signal and transistor 718 is activated responsive to the potential of the TDC node 706 (e.g., indicated at point 852), both transistors 718 and 742 will pull up the input of LATCH 744 to a potential of the voltage source 732.

It is noted that the diode (e.g., sense circuit diode) 764 allows the potential of the TDC node 706 to fall below a potential of the bit line 714 as indicated by points 850 and 852 according to various embodiments of the present disclosure. Thus, a higher VSRC potential might be applied to the source 750 during a sensing operation and yet transistor (e.g., sense transistor) 718 might still be reliably activated indicative that the selected memory cell has been activated, for example. The higher source potential VSRC allows for a larger effective −Vgs of a selected memory cell, such as respective to the lower potential (e.g., 0V) 804 of the ramped potential and the applied VSRC, to be established between the gate terminal 736 and the source terminal 738 of the selected memory cell 734. This facilitates an increase in the negative range (e.g., negative limit) of threshold voltages which might be sensed without requiring generating negative voltages in the memory device according to various embodiments of the present disclosure. Further, sensing the activation of transistor 718 might occur more definitively in that transistor 718 is sensed periodically and not continuously. It is more likely that the potential of the TDC node 706 might discharge to a level closer to closer to or below the threshold voltage of transistor 718 between each periodic sensing of transistor 718 than if the sensing (e.g., determining activation) of transistor 718 were performed continuously, for example.

Upon the activation of transistor 718 and transistor 742, LATCH 744 will transition the logic level of the sense circuit output signal SA 746 from a low level to a high level responsive to the LATCH input being pulled up to the potential of the voltage source 732. The LATCH 744 is configured to maintain the logic high level of the SA signal on signal line SA 746 for the remainder of the sensing operation according to one or more embodiments of the present disclosure. LATCH 744 might maintain the logic high level on the SA signal line 746 even if one or more subsequent pulses 854 on the TDC node increases the potential of the TDC node 706 above the threshold voltage of transistor 718, for example.

A threshold voltage (e.g., actual threshold voltage), or a value corresponding to a threshold voltage of the selected memory cell 734 might be determined by the potential (e.g., indicated at point 856) of the ramped potential VSEL_WL 802 when the SA signal of the SA signal line 746 changes states, such as from logic low to logic high (e.g., shown at time T2 of FIG. 8), in response to the activation of the selected transistor 734. The determined threshold voltage (e.g., actual or a value corresponding to a threshold voltage) might be determined by consideration of one or more effects of the VSRC potential on the source, a lower and upper potential of a ramped VSEL_WL potential applied to the selected memory cell, a body effect and/or the rate of discharge of the TDC node as discussed above, according to various embodiments of the present disclosure. Further, a programmed state of a selected memory cell might then be determined responsive to determining an actual threshold voltage of the selected memory cell and/or a value corresponding to a threshold voltage of the selected memory cell.

It is further noted that transistor 760 establishes a charge pathway from transistor 716 and the TDC node 706 while it is activated by the BOOST_EN signal during the precharge phase. Whereas, diode 764 establishes a charge pathway from the TDC node 706 to transistor 716 during the sensing phase of the sensing operation (as transistor 760 is deactivated during the sensing phase) according to various embodiments of the present disclosure, for example. Thus, during the sensing phase as discussed above, diode 764 allows for a potential of the TDC node 706 to discharge into the bit line 714 by way of transistor 716. However, diode 764 inhibits a potential of the bit line 714 from discharging into the TDC node 706 while transistor 760 is deactivated during the sensing phase according to various embodiments of the present disclosure. The diode 764 illustrated in FIG. 7 might comprise a diode connected transistor, such as a diode connected NMOS type transistor, for example. Transistors 716 and 760 might comprise NMOS type transistors whereas transistors 704, 718 and 742 might comprise PMOS type transistors according to various embodiments of the present disclosure.

Figure 9:
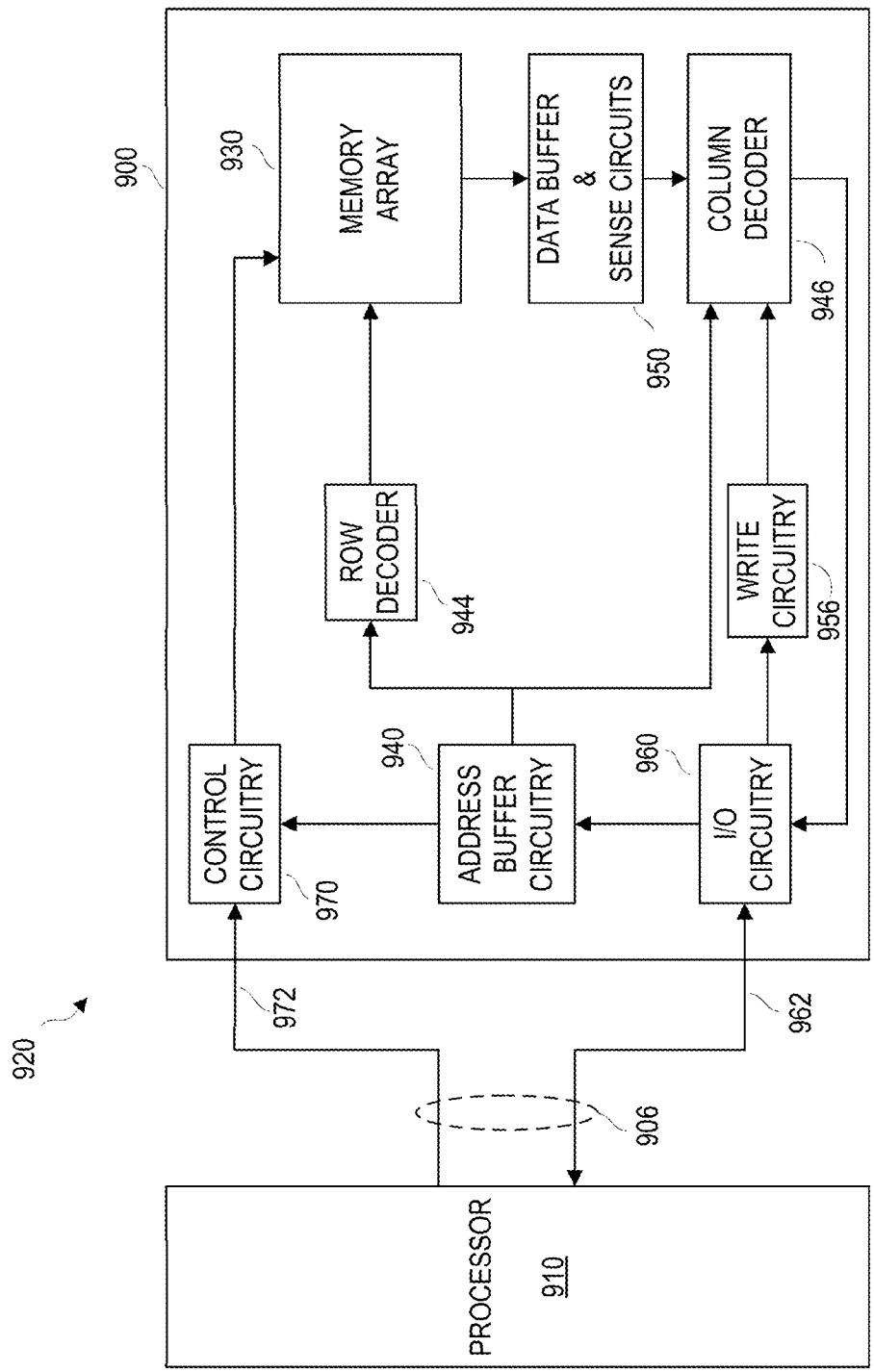
FIG. 9 illustrates a memory device coupled to a processor as part of an electronic system according to an embodiment of the present disclosure.

FIG. 9 illustrates a functional block diagram of a memory device 900 according to various embodiments of the present disclosure. The memory device 900 is coupled to an external memory access device, e.g. processor 910, such as an external controller. The processor 910 may be a processor or some other type of controlling circuitry. The memory device might be configured to perform one or more sensing operations in the memory device according to various embodiments responsive to receiving a command from the processor 910, for example. The memory device 900 has been simplified to focus on features of the memory device that are helpful in understanding various embodiments of the present disclosure.

The memory device 900 is coupled to the processor 910 over one or more communications channels 906 (e.g., communications bus.) The communications bus might comprise command, address and/or data signal lines for transmitting signals representing commands, addresses and/or data, respectively. The communications bus 906 might comprise a number of standard interfaces, such as a Universal Serial Bus (USB) interface, for example. The communications bus 906 might be a standard interface used with many hard disk drives (e.g., SATA, PATA) as are known to those skilled in the art. Together, the memory device 900, processor 910 and communications bus 906 form part of an electronic system 920.

The memory device 900 includes one or more arrays of memory cells 930. Memory array 930 might comprise memory such as flash memory and/or phase change memory (PCM.) For example, memory array 930 might comprises an array of NAND configured flash memory cells, such as discussed above with respect to FIG. 1. The one or more memory arrays 930 might comprise 2D and/or 3D memory arrays. The memory array 930 might include multiple banks and blocks of memory cells residing on a single or multiple die as part of the memory device 900. Memory array 930 might comprise SLC and/or MLC memory. The memory array 930 might also be adaptable to store varying densities (e.g., MLC (four-level) and MLC (eight-level)) of data in each memory cell, for example.

Address buffer circuitry 940 is provided to latch address signals provided through I/O circuitry 960. Address signals are received and decoded by a row decoder 944 and a column decoder 946 to access the memory array 930.

The memory device 900 reads memory cells in the memory array 930 by sensing voltage or current changes in the memory array columns using data buffer/sense circuits 950. The sense circuits 950 might comprise one or more of the sense circuits 700 discussed above with respect to FIG. 7 according to various embodiments of the present disclosure. The sense circuits 950, in one embodiment, are coupled to read and latch a row (e.g., page) of data from the memory array 930. Data are input and output through the I/O circuitry 960 for bidirectional data communication as well as the address communication over a plurality of data connections 962 with the processor 910. Write circuitry 956 is provided to write data to the memory array.

An internal controller (e.g., control circuitry 970) decodes signals provided on data connections of a control interface 972 from the external processor 910. These signals are used to control the operations on the memory array 930, including data read, data write (program), and erase operations. The data connections 972 and data connections 962 might be combined, or combined in part to form the communications bus 906 discussed above. The internal control circuitry 970 may be a state machine, a sequencer, or some other type of control circuitry that is configured to control generation of memory control signals. Control circuitry 970 is configured, at least in part, to facilitate implementing various embodiments of the present disclosure. According to various embodiments, control circuitry 970 is configured to generate and manage one or more control signals, such as the various signals discussed above with respect to FIGS. 7 and 8, for example.

Control circuitry 970 might be configured to determine a threshold voltage (e.g., actual or a value corresponding to a threshold voltage) by consideration of one or more effects of the VSRC potential on the source, a lower and upper potential of a ramped VSEL_WL potential applied to the selected memory cell, a body effect and/or the rate of discharge of the TDC node as discussed above, according to various embodiments of the present disclosure. Further, control circuitry 970 might be configured to determine a programmed state of a selected memory cell responsive to determining an actual threshold voltage of the selected memory cell and/or a value corresponding to a threshold voltage of the selected memory cell.

Control circuitry 970 might be coupled to one or more of the elements of the memory device 900 other than shown in FIG. 9. For example, the control circuitry 970 might be coupled to the row decoder 944 and configured to bias particular word lines of the memory array 930, such as by causing the row decoder 944 driver circuitry to apply particular voltages to the word lines as described herein. Control circuitry 970 might further be configured to determine and regulate the frequency of signals to activate and deactivate transistor 742 to sample a potential of the TDC node 706 such as discussed above with respect to FIGS. 7 and 8, for example. Control circuitry 970 might be coupled (not shown in FIG. 9) to and configured to cause the data buffer and sense circuits 950 to bias particular bit lines of the array 930. Control circuitry 970 might further comprise one or more register circuits.

The memory device illustrated in FIG. 9 has been simplified to facilitate a basic understanding of the features of the memory. A more detailed understanding of internal circuitry and functions of flash memories are known to those skilled in the art

CONCLUSION

Sensing operations in memory devices have been described. In particular, methods and apparatus to facilitate sensing negative threshold voltages of memory cells absent generating negative potentials in ramped word line sensing operations have been discussed.

Although specific embodiments have been illustrated and described herein, it will be appreciated by those of ordinary skill in the art that any arrangement, which is calculated to achieve the same purpose, may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory, comprising:
   precharging a data line to a first voltage level;
   precharging a sense node to a second voltage level;
   connecting the data line to a memory cell selected for sensing;
   selectively discharging the data line through the memory cell responsive to a voltage level applied to a control gate of the memory cell;
   connecting the sense node to the data line responsive to the data line discharging through the memory cell; and
   after connecting the sense node to the data line responsive to the data line discharging through the memory cell:
      discharging the sense node to the data line while a voltage level of the sense node is greater than a voltage level of the data line; and
      inhibiting discharging of the data line to the sense node while the voltage level of the data line is greater than the voltage level of the sense node.

2. The method of claim 1, further comprising:
   sensing the voltage level of the sense node.

3. The method of claim 2, wherein sensing the voltage level of the sense node comprises indicating whether the voltage level of the sense node has reached a particular level.

4. The method of claim 3, wherein indicating whether the voltage level of the sense node has reached the particular level comprises indicating whether a transistor having a control gate connected to the sense node is activated in response to the voltage level of the sense node.

5. The method of claim 4, further comprising:
   latching the indication that the transistor is activated in response to the voltage level of the sense node.

6. The method of claim 1, wherein discharging the sense node to the data line while the voltage level of the sense node is greater than the voltage level of the data line comprises discharging the sense node to the data line while the sense node is boosted to a voltage level greater than the voltage level of the data line, and wherein inhibiting discharging of the data line to the sense node while the voltage level of the data line is greater than the voltage level of the sense node comprises inhibiting discharging of the data line to the sense node while the sense node is de-boosted to a voltage level less than the voltage level of the data line.

7. The method of claim 6, further comprising:
   sensing the voltage level of the sense node while the sense node is de-boosted.

8. The method of claim 1, wherein precharging the sense node to the second voltage level comprises precharging the sense node to a voltage level greater than the first voltage level.

9. A method of operating a memory, comprising:
   precharging a data line to a first voltage level;
   precharging a sense node to a second voltage level;
   connecting the data line to a memory cell selected for sensing;
   selectively discharging the data line through the memory cell responsive to a voltage level applied to a control gate of the memory cell;
   periodically boosting and de-boosting a voltage level of the sense node;
   connecting the sense node to the data line responsive to the data line discharging through the memory cell; and
   after connecting the sense node to the data line responsive to the data line discharging through the memory cell:

discharging the sense node to the data line while a voltage level of the sense node is greater than a voltage level of the data line; and inhibiting discharging of the data line to the sense node while the voltage level of the data line is greater than the voltage level of the sense node.

10. The method of claim 9, further comprising:

periodically sensing the de-boosted voltage level of the sense node.

11. The method of claim 10, wherein periodically sensing the de-boosted voltage level of the sense node comprises:

selectively activating a first transistor having a control gate connected to the sense node; and periodically activating a second transistor connected in series with the first transistor between a voltage node and a latch.

12. The method of claim 9, wherein selectively discharging the data line through the memory cell responsive to the voltage level applied to the control gate of the memory cell comprises selectively discharging the data line through the memory cell responsive to an increasing voltage level applied to the control gate of the memory cell.

13. The method of claim 9, wherein discharging the sense node to the data line comprises discharging the sense node to the data line through a diode, and wherein inhibiting discharging of the data line to the sense node comprises reverse biasing the diode.

14. A sense circuit, comprising:

an input node;

a sense node;

a path between the input node and the sense node facilitating current flow from the sense node to the input node when a voltage level of the sense node is greater than a voltage level of the input node, and inhibiting current flow from the input node to the sense node when the voltage level of the sense node is less than the voltage level of the input node; and circuitry configured to provide an output indicative of whether the voltage level of the sense node has reached a particular level.

15. The sense circuit of claim 14, wherein the path between the input node and the sense node comprises a diode.

16. The sense circuit of claim 15, wherein the path between the input node and the sense node further comprises a transistor between the input node and the diode.

17. The sense circuit of claim 14, further comprising:

circuitry to boost and de-boost the voltage level of the sense node, wherein the sense node is between the path between the input node and the sense node and the circuitry to boost and de-boost the voltage level of the sense node.

18. The sense circuit of claim 17, wherein the circuitry to boost and de-boost the voltage level of the sense node comprises a capacitor to capacitively couple a voltage pulse to the sense node.

19. The sense circuit of claim 14, wherein the circuitry configured to provide the output comprises a latch selectively connected to a voltage node through a transistor having a control gate connected to the sense node.

20. The sense circuit of claim 19, wherein the latch is further selectively connected to the voltage node through a second transistor having a control gate connected receive a control signal.

* * * * *